(12) United States Patent
Liu et al.

(10) Patent No.: US 10,444,272 B2
(45) Date of Patent: Oct. 15, 2019

(54) METHOD AND APPARATUS FOR DETECTION OF POWER SYSTEM DISTURBANCE WITHIN A DIGITAL SUBSTATION

(71) Applicant: ABB Schweiz AG, Baden (CH)

(72) Inventors: Kai Liu, Beijing (CN); Youyi Li, Vasteras (SE); Jianping Wang, Vasteras (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/701,221

(22) Filed: Sep. 11, 2017

(65) Prior Publication Data
US 2018/0024183 A1    Jan. 25, 2018

Related U.S. Application Data

(63) Continuation of application No. PCT/CN2015/074001, filed on Mar. 11, 2015.

(51) Int. Cl.
  *G01R 31/08* (2006.01)
  *H02J 13/00* (2006.01)
  *H02H 7/26* (2006.01)

(52) U.S. Cl.
  CPC .......... *G01R 31/085* (2013.01); *G01R 31/086* (2013.01); *G01R 31/088* (2013.01);
  (Continued)

(58) Field of Classification Search
  CPC ....... G06Q 10/00; G06Q 2220/00; H02J 1/00; G05B 1/00; G05B 2219/00; G01R 1/00
  See application file for complete search history.

(56) References Cited

U.S. PATENT DOCUMENTS 4,371,907 A * 2/1983 Bignell ................ H02H 7/265
  361/79
2008/0065270 A1* 3/2008 Kasztenny .......... H02J 13/0065
  700/286

(Continued)

FOREIGN PATENT DOCUMENTS

CN    101447698 A    6/2009
CN    101699704 A    4/2010

(Continued)

OTHER PUBLICATIONS

International Search Report and Written Opinion, PCT/CN2015/074001, dated Aug. 26, 2015, 9 pages.

(Continued)

*Primary Examiner* — Jermele M Hollington
*Assistant Examiner* — Temilade S Rhodes-Vivour
(74) *Attorney, Agent, or Firm* — J. Bruce Schelkopf; Taft Stettinius & Hollister LLP

(57) ABSTRACT

An objective of the application is to provide a method for detecting a disturbance in a power system within a digital substation and an apparatus using the same. The method includes: sensing electrical parameters at an end of a transmission line; sampling the sensed electrical parameters; extracting traveling-wave information from high frequency component of the samples using a signal processing method; and if the extracted traveling-wave information indicating occurrence of the disturbance, transmitting the extracted traveling-wave information to an intelligent electronic device of the digital substation from a merging unit or non-conventional instrument transformer of the digital substation. As compared with the amount of the sample data of the sensed electrical parameters, the amount of the data representing the extracted traveling-wave information is reduced. Thus the extracted traveling-wave information can be transmitted via a data link with a relatively narrow (Continued)

bandwidth, such as the process bus under standard IEC 61850.

18 Claims, 3 Drawing Sheets

(52) U.S. Cl.
CPC ............. *H02H 7/265* (2013.01); *H02J 13/00* (2013.01); *Y04S 10/522* (2013.01)

(56) References Cited

U.S. PATENT DOCUMENTS

| | | | | |
|---|---|---|---|---|
| 2008/0077336 | A1* | 3/2008 | Fernandes | G01R 15/142 |
| | | | | 702/57 |
| 2010/0217548 | A1* | 8/2010 | Faybisovich | G01R 31/085 |
| | | | | 702/59 |
| 2011/0077885 | A1* | 3/2011 | Zweigle | G01R 19/2513 |
| | | | | 702/66 |
| 2011/0130991 | A1* | 6/2011 | Koste | G01R 19/2506 |
| | | | | 702/72 |
| 2012/0019297 | A1* | 1/2012 | Swarztrauber | G01D 4/004 |
| | | | | 327/159 |
| 2013/0006433 | A1* | 1/2013 | Itagaki | H02H 7/26 |
| | | | | 700/292 |
| 2013/0015878 | A1 | 1/2013 | Perera et al. | |
| 2013/0021039 | A1* | 1/2013 | Bjorklund | G01R 31/088 |
| | | | | 324/535 |
| 2013/0096854 | A1* | 4/2013 | Schweitzer, III | G01R 31/085 |
| | | | | 702/59 |
| 2013/0204443 | A1* | 8/2013 | Steven | G06Q 50/06 |
| | | | | 700/286 |
| 2016/0216310 | A1* | 7/2016 | Schweitzer, III | G01R 31/088 |
| 2016/0239010 | A1* | 8/2016 | McDaniel | H02J 3/00 |

FOREIGN PATENT DOCUMENTS

| | | |
|---|---|---|
| CN | 102122815 A | 7/2011 |
| CN | 102157981 A | 8/2011 |
| CN | 102386678 A | 3/2012 |
| CN | 103840556 A | 6/2014 |
| KR | 20040042092 A | 5/2004 |
| WO | 2013064176 A1 | 5/2013 |
| WO | 2014053174 A1 | 4/2014 |

OTHER PUBLICATIONS

European Patent Office, Extended Search Report in corresponding Application No. 15884251.8, dated Oct. 25, 2018, 8 pages.

The State Intellectual Property Office of the P. R. of China, First Office Action and Patent Search Report in corresponding application No. 201580075208.2, dated Jul. 11, 2019, 6 pp.

* cited by examiner

METHOD AND APPARATUS FOR DETECTION OF POWER SYSTEM DISTURBANCE WITHIN A DIGITAL SUBSTATION

TECHNICAL FIELD

The invention relates to a power system within a digital substation, and more particularly to a method for detecting disturbance in the power system, an apparatus using the same and the digital substation.

BACKGROUND ART

Power system is a network of electrical components used to supply, transmit and use electric power. Transmission lines are considered as main elements in the power system. Any disturbances occurring in the transmission lines need to be detected, and isolated as soon as they occur if they indicate a fault. Therefore high speed and secured protection is essential to maintain a reliable power system to satisfy customer daily needs. The transmission lines are protected using impedance relays usually arranged in a substations of the power system. Patent WO 2013/064176 A1 discloses one of such examples. According to the patent, a method of fault detection in a power transmission line is provided. The fault detection is based on fault-induced travelling waves. In particular, a voltage sensor and a current sensor such as voltage transformer and current transformer, are arranged for measuring the voltage and current at an end of the transmission line, and an estimating means is arranged for estimating a pre-fault voltage and current as well as the amplitude of the fault-induced travelling wave based on the voltage and current measurements performed by the voltage sensor and current sensor. In the substation, the secondary sides of current transformer and voltage transformer are directly connected to the relay by cable wires.

With the development of digital technology, a power system within a digital substation becomes more and more popular, where a merging unit is arranged between the electrical parameter sensor (such as voltage sensor and current sensor) and the intelligent electronic device (IED). Electrical parameters measured by the electrical parameter sensors at one end of the transmission line are communicated to IED successively via the merging unit and a process bus. Regards travelling wave protection, the electrical parameter sensor normally needs higher sampling rate to acquire the high frequency transient of travelling wave front, for example 10 kHz to 10 MHz. While according to the IEC61850 standard for a digital substation, the sampling rates of merging unit for protection is 4.8 k Hz for 60 Hz power systems and 4 kHz for 50 Hz power systems. The process bus schemes for 60 Hz power systems and 50 Hz power systems are also respectively designed for the sampling rates at 4.8 k Hz and 4 kHz as well. The bandwidth of the process bus is not broad enough for transmitting the samples from the higher sampling rate of the electrical parameter sensor. Thus, the bandwidth limitation of the process bus can be considered as a main challenge or bottleneck to implement travelling wave based protection and fault location used for the power system within a digital substation environment.

BRIEF SUMMARY OF THE INVENTION

It is therefore an objective of the invention to provide a method for detecting a disturbance in a power system within a digital substation, including: sensing electrical parameters at an end of a transmission line; sampling the sensed electrical parameters; extracting travelling-wave information from high frequency component of the samples using a signal processing method; and if the extracted travelling-wave information indicating occurrence of the disturbance, transmitting the extracted travelling-wave information to an intelligent electronic device of the digital substation from a merging unit or non-conventional instrument transformer of the digital substation.

According to another aspect of present invention, it is provided a disturbance detection apparatus for a power system within a digital substation, including: an electrical parameter sensor for sensing electrical parameter at an end of a transmission line; a sampling device, for sampling the sensed electrical parameter; a processor, for extracting travelling-wave information from high frequency component of the samples using a signal processing method and judging if it indicates occurrence of the disturbance; and a transmitter, for transmitting the extracted travelling-wave information to an intelligent electronic device of the digital substation from a merging unit or non-conventional instrument transformer of the digital substation if it indicates the occurrence of the disturbance.

According to another aspect of present invention, it is provided a digital substation including the disturbance detection apparatus, the merging unit and the intelligent electronic device.

As compared with the amount of the sample data of the sensed electrical parameters, the amount of the data representing the extracted travelling-wave information is reduced. Thus the extracted travelling-wave information can be transmitted via a data link with a relatively narrow bandwidth, such as the process bus under standard IEC 61850.

The disturbance detection apparatus has several benefits over the conventional such as reuse of the process bus with relatively narrow bandwidth to transmit disturbance-introduced information to IED, more efficient use of the bandwidth of the process bus, reduction of the cost for IED, and decreasing processor load of IED and communication burden within a digital substation.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
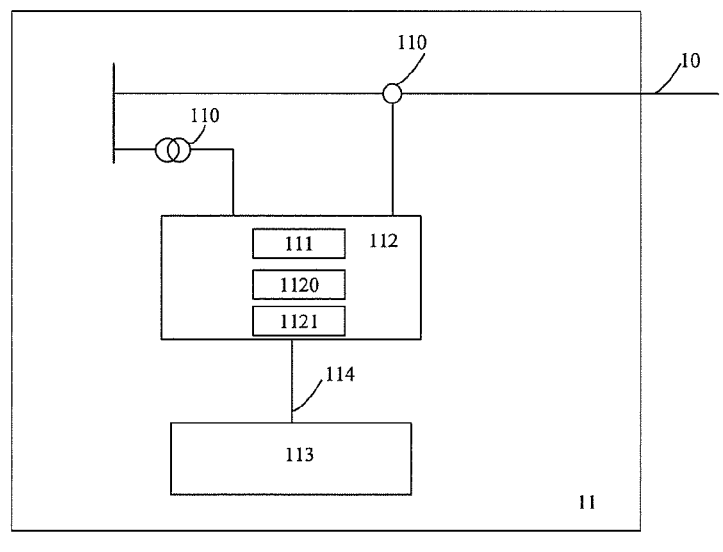
FIG. 1 illustrates a power system with digital substation within digital substation according to an embodiment of present invention.

FIG. 1 illustrates a power system within digital substation according to an embodiment of present invention. As shown in FIG. 1, a power system 1 includes a transmission line 10 and a digital substation 11. The digital substation 11 includes an end of the transmission line 10, an electrical parameter sensor 110, a sampling device 111, a merging unit 112, and an intelligent electronic device (IED) 113. The merging unit 112 and the IED 113 can communicated with each other via a data link 114. The merging unit 112 further includes a processor 1120 and a transmitter 1121 that are arranged in the merging unit 112. The electrical parameter sensor 110 is arranged at an end of the transmission line 10 for measuring an electrical parameter at the end of the transmission line 10. The disturbance detection apparatus for the power system within digital substation at least includes the electrical parameter sensor 110, the sampling device 111, the processor 1120, and the transmitter 1121.

In the embodiment according to FIG. 1, the electrical parameter sensor 110 may be a current transformer (CT) or a voltage transformer (VT), or both of CT and VT. As an alternative, the digital substation 11 may have two electrical parameter sensors 110, of which one is CT and the other is VT. The electrical parameter sensor 110 behaving as CT is arranged in a way that it measures the current entering (or leaving) the end of the transmission line 10, while the electrical parameter 110 behaving as VT is arranged in a way that it measures the voltage at the end of the transmission line 10. The sampling device 111 can sample the sensed electrical parameter from the electrical parameter sensor 110 at a relatively high sampling rate, for example 10 kHz up to 10 MHz, so that the electrical parameter for the end of the transmission line 10 can be reconstructed with sufficient accuracy. For example in some cases, the sensor can detect two or more adjacent travelling wave arriving time, which needs high sampling rate because travelling wave speed is high, and a sampling rate of 10 MHz is needed. In other cases, the timing information may not be needed, for example the direction element based on travelling wave does not need so high frequency, the sampling rate of 10 kHz is enough. The IED 113 can receive data from the merging unit 112, and can issue control commands, such as tripping circuit breakers if they sense voltage, current, or frequency abnomalies. For example, the IED can include a protection relay for breaking the short circuit and/or a fault locater for locating the location of the fault. The data link 114 between the merging unit 112 and the IED 113 can be a process bus designed according to IEC 61850 according to which its bandwidth is set in a relatively narrow range, for example, between 4-4.8 kHz. There exists a gap between the sampling rate of sensed electrical parameter and the bandwidth of the process bus under the standard of IEC 61850. If the electrical parameter samples at a higher sampling rate are transmitted via the process bus with a narrower bandwidth, the disturbance information, especially high frequency components, cannot be reconstructed at the IED 113 side with sufficient accuracy. In addressing this problem, the processor 1120 is adapted for extracting travelling-wave information from high frequency component of the samples using a signal processing method, and judging if it indicates occurrence of the disturbance. The transmitter 1121 can transmit the extracted travelling-wave information to the intelligent electronic device 113 of the digital substation 11 from the merging unit 112 of the digital substation 11 if it indicates the occurrence of the disturbance.

Figure 2A:
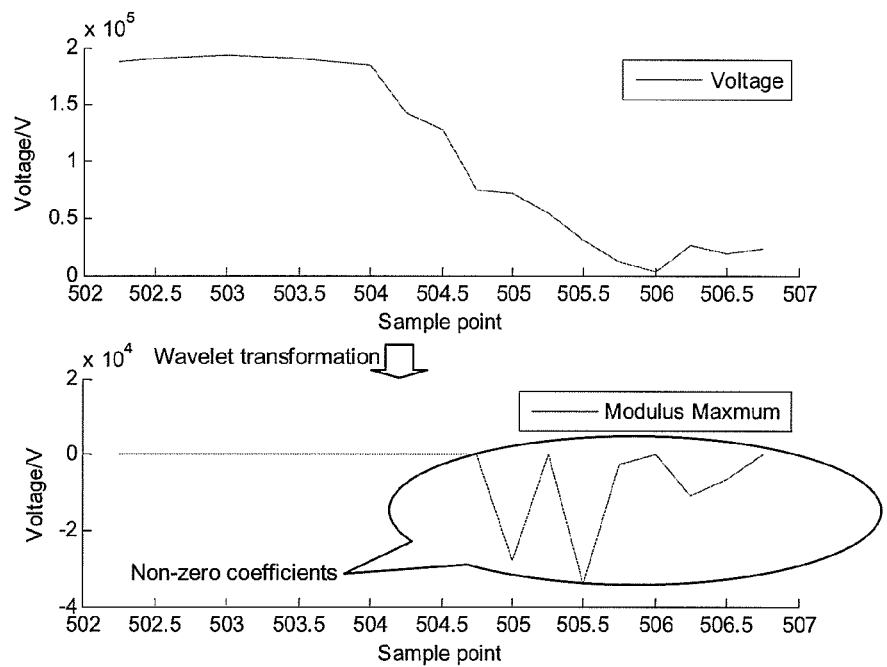
FIGS. 2A and 2B illustrate the extraction of travelling-wave information from high frequency component of voltage disturbance using wavelet transformation according to an embodiment of present invention.
Figure 2B:
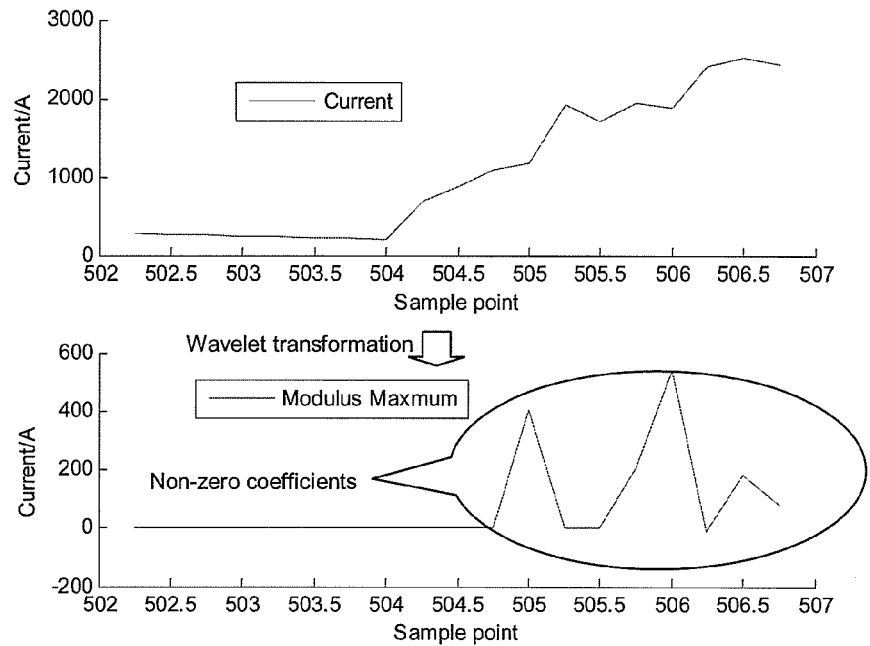

FIGS. 2A and 2B illustrate an example for the extraction of travelling-wave information from high frequency component of voltage disturbance using wavelet transformation according to an embodiment of present invention. FIG. 2A depicts the wave form of the voltage, the voltage samples and wavelet coefficients during an example of disturbance over time, and FIG. 2B depicts the wave form of the current, the current samples and wavelet coefficients during an example of disturbance over time. In this example case according to FIG. 2A, the wavelet transformation coefficients are all zero before disturbance occurs; where the voltage disturbance occurs introducing high frequency components, several wavelet transformation coefficients appear above and/or below zero, which are meaningful for representing the occurrence of the disturbance. These non-zero coefficients represent the information on the travelling wave and provide enough information for travelling wave protection and fault location. The skilled person shall understand other transformation, for example, filter-based signal processing method, can also be applied to extract the travelling-wave information. Besides, the signal processing method can also be used for current measurements from CT according to FIG. 2B.

As compared with the amount of the sample data of the sensed electrical parameters, the amount of the data representing the extracted travelling-wave information is reduced. Thus the extracted travelling-wave information can be transmitted via a data link with a relatively narrow bandwidth, such as the process bus under standard IEC 61850.

The disturbance detection apparatus has several benefits over the conventional one such as reuse of the process bus with relatively narrow bandwidth to transmit disturbance-introduced information to IED, more efficient use of the bandwidth of the process bus, reduction of the cost for IED, and decreasing processor load of IED and communication burden within a digital substation.

The extracted travelling-wave information represents polarity, amplitude, direction, rate of change and/or timing of the travelling-wave. In the IED which uses travelling wave information to indicate disturbance, wavelet transformation method or other kinds of filters are used to extract the effective information of the transient voltage/current signal. For the wavelet transformation method, many kinds of wavelet can be used, such as Meyer wavelet, Gaussian wavelet, Monet wavelet, et al. By wavelet transformation for the original signal and through modulus maximum algorithm, the polarity, amplitude, direction, rate of change and/or timing of travelling wave can be obtained. In some cases, the rate of change of travelling wave may be required, it can be directly calculated by the sampled points, by $(i_k - i_{k-n})/(n\Delta t)$, where k is the sampling sequence number, $\Delta t$ is the time between two adjacent sample points. Usually, the disturbance can be judged if the amplitude of travelling wave exceeds a threshold and this threshold should be set to ensure the detection of slight disturbance.

Preferably, the transmitter 1121 is further adapted for transmitting the extracted travelling-wave information to a disturbance recorder of the digital substation if it indicates existence of the disturbance.

Figure 3:
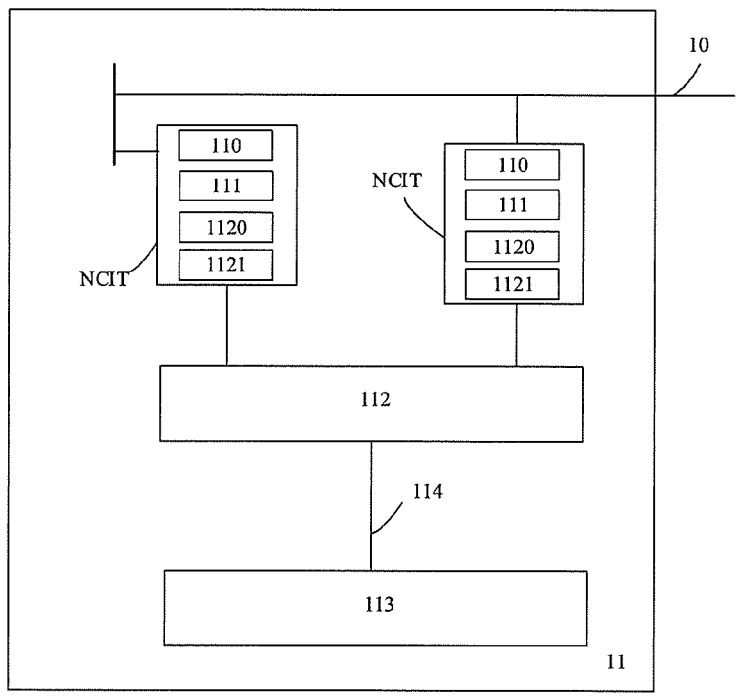
FIG. 3 illustrates a power system with a digital substation according to another embodiment of present invention.

FIG. 3 illustrates a power system with a digital substation according to another embodiment of present invention. As compared with the embodiment according to FIG. 1, the solution according FIG. 3 is different in that: the electrical parameter sensor 110 is replaced by non-conventional instrument transformer (NCIT), and the NCIT includes the electrical parameter sensor 110, the sampling device 111, and the processor 1120 and the transmitter 1121 which are implemented by the sensor, sampling device, processor and transmitter provided in the NCIT. The electrical parameter sensor 110 in the NCIT can be Hall sensor, Rogowski sensor and Faraday effect based optical sensor (magneto-optic effect).

Figure 4:
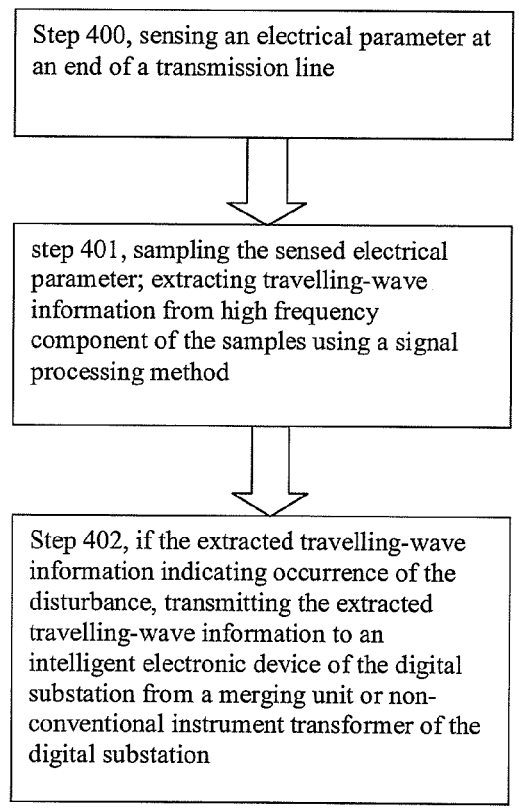
FIG. 4 illustrates the main steps involved in the method for detecting a disturbance in a power system within digital substation.

FIG. 4 illustrates the main steps involved in the method for detecting a disturbance in a power system within a digital substation. In step 400, sensing an electrical parameter at an end of a transmission line. The electrical parameter, such as voltage and/or current, can be sensed by the electrical parameter sensor according to FIGS. 1 and 3. In step 401, sampling the sensed electrical parameter; extracting travelling-wave information from high frequency components of the samples using a signal processing method. For example, wavelet transformation can be applied according to FIG. 2 to extract the high frequency component of the voltage/current samples. The wavelet transformation is a technique that is used to decompose a given signal into different frequency components to provide wavelet packet coefficients. In step 402, if the extracted travelling-wave information indicating occurrence of the disturbance, transmitting the extracted travelling-wave information to an intelligent electronic device of the digital substation from a merging unit or non-conventional instrument transformer of the digital substation.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for detecting a disturbance in a power system within a digital substation, including:
   sensing electrical parameters at an end of a transmission line;
   sampling the sensed electrical parameters using a sampling rate between 10 kHz to 10 MHz;
   extracting travelling-wave information from a high frequency component of the samples using a signal processing method, wherein the travelling-wave information represents polarity, direction, amplitude, rate of change and/or timing of the travelling-wave; and
   if the extracted travelling-wave information indicates occurrence of the disturbance, transmitting the extracted travelling-wave information to an intelligent electronic device of the digital substation from a merging unit or non-conventional instrument transformer of the digital substation, wherein the merging unit or non-conventional instrument transformer is structured to communicate with the intelligent electronic device according to IEC 61850 communication protocols.

2. The method according to claim 1, wherein:
   the electrical parameters are voltage, current at the end of the transmission line.

3. The method according to claim 2, wherein:
   the signal processing method is one of wavelet transformation or filter-based signal processing method.

4. The method according to claim 2, further including:
   if the extracted travelling-wave information indicates existence of the disturbance, transmitting it to a disturbance recorder of the digital substation from a merging unit or non-conventional instrument transformer of the digital substation.

5. The method according to claim 1, wherein:
   the signal processing method is one of wavelet transformation or filter-based signal processing method.

6. The method according to claim 1, further including:
   if the extracted travelling-wave information indicates existence of the disturbance, transmitting it to a disturbance recorder of the digital substation from a merging unit or non-conventional instrument transformer of the digital substation.

7. The method according to claim 1, wherein:
   the intelligent electronic device includes a protection relay and/or a fault locator.

8. A disturbance detection apparatus for a power system within a digital substation, including:
   an electrical parameter sensor for sensing an electrical parameter at an end of a transmission line;
   a sampling device, for sampling the sensed electrical parameter using a sampling rate between 10 kHz to 10 MHz;
   a processor, for extracting travelling-wave information from high frequency component of the samples using a signal processing method and judging if it indicates occurrence of the disturbance, wherein the travelling-wave information represents polarity, direction, amplitude, rate of change and/or timing of the travelling-wave; and
   a transmitter arranged in a merging unit of the digital substation or a non-conventional instrument transformer of the digital substation, for transmitting the extracted travelling-wave information to an intelligent electronic device of the digital substation from the merging unit or the non-conventional instrument transformer using IEC 61850 communication protocols if the extracted travelling-wave information indicates the occurrence of the disturbance.

9. The disturbance detection apparatus according to claim 8, wherein:
   the sampling device is arranged in the merging unit of the digital substation or the non-conventional instrument transformer of the digital substation.

10. The disturbance detection apparatus according to claim 9, wherein:
    the processor is arranged in the merging unit of the digital substation or the non-conventional instrument transformer of the digital substation.

11. The disturbance detection apparatus according to claim 9, wherein:
    the electrical parameter sensor is of a current transformer or as a part of the non-conventional instrument transformer.

12. The disturbance detection apparatus according to claim 8, wherein:
    the processor is arranged in the merging unit of the digital substation or the non-conventional instrument transformer of the digital substation.

13. The disturbance detection apparatus according to claim 8, wherein:
    the electrical parameter sensor is of a current transformer or as a part of the non-conventional instrument transformer.

14. The disturbance detection apparatus according to claim 8, wherein:

the electrical parameter sensor is of a voltage transformer or as a part of the non-conventional instrument transformer.

15. The disturbance detection apparatus according to claim 14, wherein:
the transmitter is further adapted for transmitting the extracted travelling-wave information to a disturbance recorder of the digital substation if it indicates existence of the disturbance.

16. The disturbance detection apparatus according claim 8, wherein:
the transmitter is further adapted for transmitting the extracted travelling-wave information to a disturbance recorder of the digital substation if it indicates existence of the disturbance.

17. The disturbance detection apparatus according claim 8, wherein:
the intelligent electronic device includes a protection relay and/or fault locator.

18. A digital substation, including:
the disturbance detection apparatus according to claim 8;
the merging unit or the non-conventional instrument transformer; and
the intelligent electronic device.

* * * * *